United States Patent [19]

Allen

[11] Patent Number: 4,849,933
[45] Date of Patent: Jul. 18, 1989

[54] BIPOLAR PROGRAMMABLE LOGIC ARRAY

[75] Inventor: Michael Allen, San Francisco, Calif.

[73] Assignee: Advanced Micro Devices, Inc., Sunnyvale, Calif.

[21] Appl. No.: 47,794

[22] Filed: May 6, 1987

[51] Int. Cl.<sup>4</sup> .................. G11C 17/00; G03K 19/082; G05F 3/16
[52] U.S. Cl. ..................... 365/96; 365/189; 365/211; 307/466; 323/313
[58] Field of Search .................. 365/94, 96, 103, 104, 365/105, 174, 189, 211, 212, 210, 175; 307/465, 466, 297, 310; 340/825.79, 825.83, 825.84, 825.85, 825.86, 825.87, 825.9, 825.94; 323/311, 312, 313, 315

[56] References Cited

U.S. PATENT DOCUMENTS

| | | | |
|---|---|---|---|
| 4,215,282 | 7/1980 | Brown et al. | 307/466 |
| 4,277,739 | 7/1981 | Priel | 323/313 |
| 4,514,650 | 4/1985 | Yum | 307/466 |
| 4,644,249 | 2/1987 | Chang | 323/313 |
| 4,742,488 | 5/1988 | Wong | 365/189 |

OTHER PUBLICATIONS

Cavlan et al., "Field PLAs Simplify Logic Design", Electronic Design, Sep. 1, 1975, pp. 84–90.

Primary Examiner—Stuart N. Hecker
Assistant Examiner—Glenn A. Gossage
Attorney, Agent, or Firm—Davis Chin

[57] ABSTRACT

A bipolar programmable logic array for producing a substantially constant current to a common sense line (16) includes a bandgap circuit portion (14) for generating a temperature-dependent reference voltage and a current source (IS) responsive to the temperature-dependent reference voltage for providing a switching current to the common sense line which is substantially constant over a wide range of temperature variations.

14 Claims, 2 Drawing Sheets

BIPOLAR PROGRAMMABLE LOGIC ARRAY

BACKGROUND OF THE INVENTION

This invention relates generally to arrays for performing logic functions and more particularly, it relates to a bipolar programmable logic array which has a high speed of operation over a wide range of temperature variations.

As is generally known, arrays for performing logic functions are typically referred to as logic arrays or programmable logic arrays (PLAs) and have been used in recent years to replace random logic in many digital circuits. Such programmable logic arrays are especially useful in the control section of digital systems and are frequently thought of as read only storage, read only memories, or the like. The programmable logic array is a well known conventional way of using arrays of identical circuit elements to implement arbitrary logic functions in integrated circuits. Such arrays are typically arranged in either what is referred to as an AND array or plane, or what is referred to as an OR array or plane.

When a programmable logic array is implemented on an integrated circuit it becomes desirable to maintain the speed of operation of the circuit over a wide temperature range. However, charging currents are generally reduced at higher temperatures due to the fact that resistors, which determine such currents, increase in their values at the higher temperatures and thus reduce the current. As a result, this decrease in the charging current causes degradation of the AC performance or switching operations. Therefore, increased propagation delays will be experienced at the higher temperatures, thereby reducing its speed of operation.

It would therefore be desirable to provide a bipolar programmable logic array like that of the present invention which has a high speed of operation over a wide range of temperature variations and maintains a constant power dissipation.

SUMMARY OF THE INVENTION

Accordingly, it is a general object of the present invention to provide an improved programmable logic array which has a high speed of operation over a wide range of temperature variations.

It is an object of the present invention to provide a bipolar programmable logic array which has a high speed of operation and maintains constant power dissipation over a wide range of temperature variations.

It is another object of the present invention to provide a bipolar programmable logic array which includes a current source connected to a common sense line for producing a switching current thereto which is substantially constant over a wide range of temperature variations.

It is still another object of the present invention to provide a bipolar programmable logic array which includes a bandgap circuit for generating a temperature-dependent reference voltage and a current source responsive to the reference voltage for producing a switching current to a common sense line which is substantially constant over a wide range of temperature variations.

In accordance with these aims and objectives, the present invention is concerned with the provision of a bipolar programmable logic array having a current source which is compensated for temperature variations. The logic array includes a plurality of input buffer/inverters, a plurality of diodes, a sense amp/output buffer, a current source, and a bandgap circuit. Each of the input buffer/inverters has an input for receiving an input logic signal and an output. Each of the plurality of diodes has its cathode connected to the respective outputs of the input buffer/inverters and its anode coupled to a common sense line. The sense amp/output buffer has its input connected to the common sense line and its output connected to an output terminal. The current source is formed of a PNP-type transistor and a resistor. The transistor has its emitter coupled to a supply potential via the resistor and its collector connected to the common sense line. The bandgap circuit is used to generate a first temperature-dependent reference voltage. The current source transistor has its base connected to receive the first temperature-dependent reference voltage. A second temperature-dependent reference voltage is generated across the resistor and varies proportionally to the changing values of the resistor over temperature so that the current flowing through the current source transistor remains substantially constant.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENTS

Figure 1:
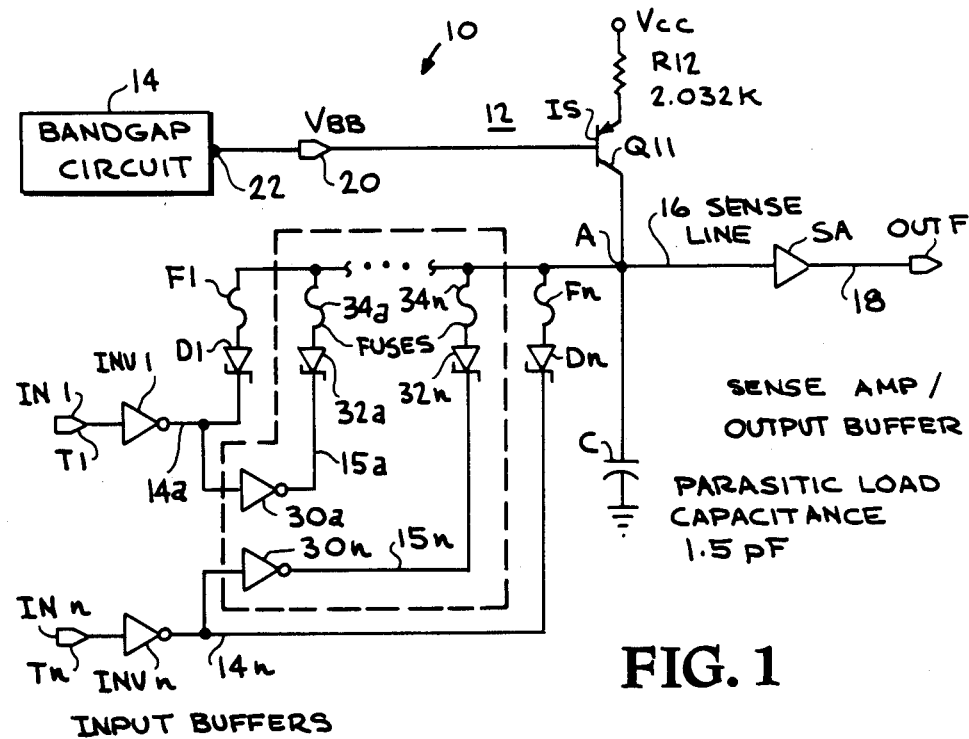
FIG. 1 is a schematic circuit diagram of a bipolar programmable logic array which is arranged in an AND array and embodies the principles of the present invention.

Referring now in detail to the drawings, there is shown in FIG. 1 a schematic circuit diagram of a bipolar programmable logic array (PLA) 10 of the present invention which is arranged in what is called an AND array. The bipolar PLA 10 has a high speed of operation and maintains constant power dissipation over a wide range of temperature variations. The bipolar PLA 10 is comprised of a logic circuit portion 12 and a bandgap circuit portion 14.

The logic circuit portion 12 includes a plurality of input buffer/inverters INV1 . . . INVn. Input logic signals IN1 . . . INn on respective input terminals T1 . . . Tn are connected to the corresponding inputs of the plurality of input buffer/inverters INV1 . . . INVn. The input buffer/inverters are standard circuits which buffer the input logic signals as well as provide an inverted output signal on lines 14a . . . 14n. The output of the inverter INV1 on the line 14a is connected to the cathode of a Schottky diode D1. The anode of the Schottky diode D1 is connected to one end of a blowable fuse F1. The other end of the fuse F1 is connected to a common node A. Similarly, the output of the inverter INVn on the line 14n is connected to the cathode of a Schottky diode Dn. The anode of the Schottky diode Dn is connected to one end of a blowable fuse Fn. The other end of the fuse Fn is connected to the common node A.

It should be understood that an optional inverter 30a may be included to generate a non-inverted output signal on line 15a. The inverter 30a has its input connected to the output of the inverter INV1 and its output connected to the cathode of an optional Schottky diode 32a. The anode of the Schottky diode 32a is connected to one end of an optional blowable fuse 34a. The other end of the fuse 34a is connected to the common node A. Similarly, an optional inverter 30n may be included to generate a noninverted output signal on line 15n. The inverter 30n has its input connected to the output of the inverter INVn and its output connected to the cathode of an optional Schottky diode 32n. The anode of the Schottky diode 32n is connected to one end of an optional blowable fuse 34n. The other end of the fuse 34n is connected to the common node A.

The logic circuit portion 12 also includes a sense amp/output buffer SA and a parasitic load capacitance C. The input of the sense amp/output buffer SA is connected to one end of the load capacitance C and to the common node A via a common sense line 16. The output of the sense amp/output buffer SA is connected to an output terminal F via line 18. The output terminal F defines the output of the bipolar PLA 10. The output terminal F provides a TTL compatible voltage which is typically swinging between +0.4 and +2.4 volts. The logic circuit portion 12 further includes a current source IS formed of a bipolar PNP-type transistor Q11 and an emitter resistor R12. The transistor Q11 has its emitter connected to one end of the resistor R12 and its collector connected to the common node A. The other end of the resistor R12 is connected to a TTL compatible supply voltage or potential VCC. The supply voltage VCC is thus typically a +5.0 volts. The base of the transistor Q11 is connected to an input terminal 20 for receiving a first temperature-dependent reference voltage VBB from the bandgap circuit portion shown as block 14 in FIG. 1.

Figure 3:
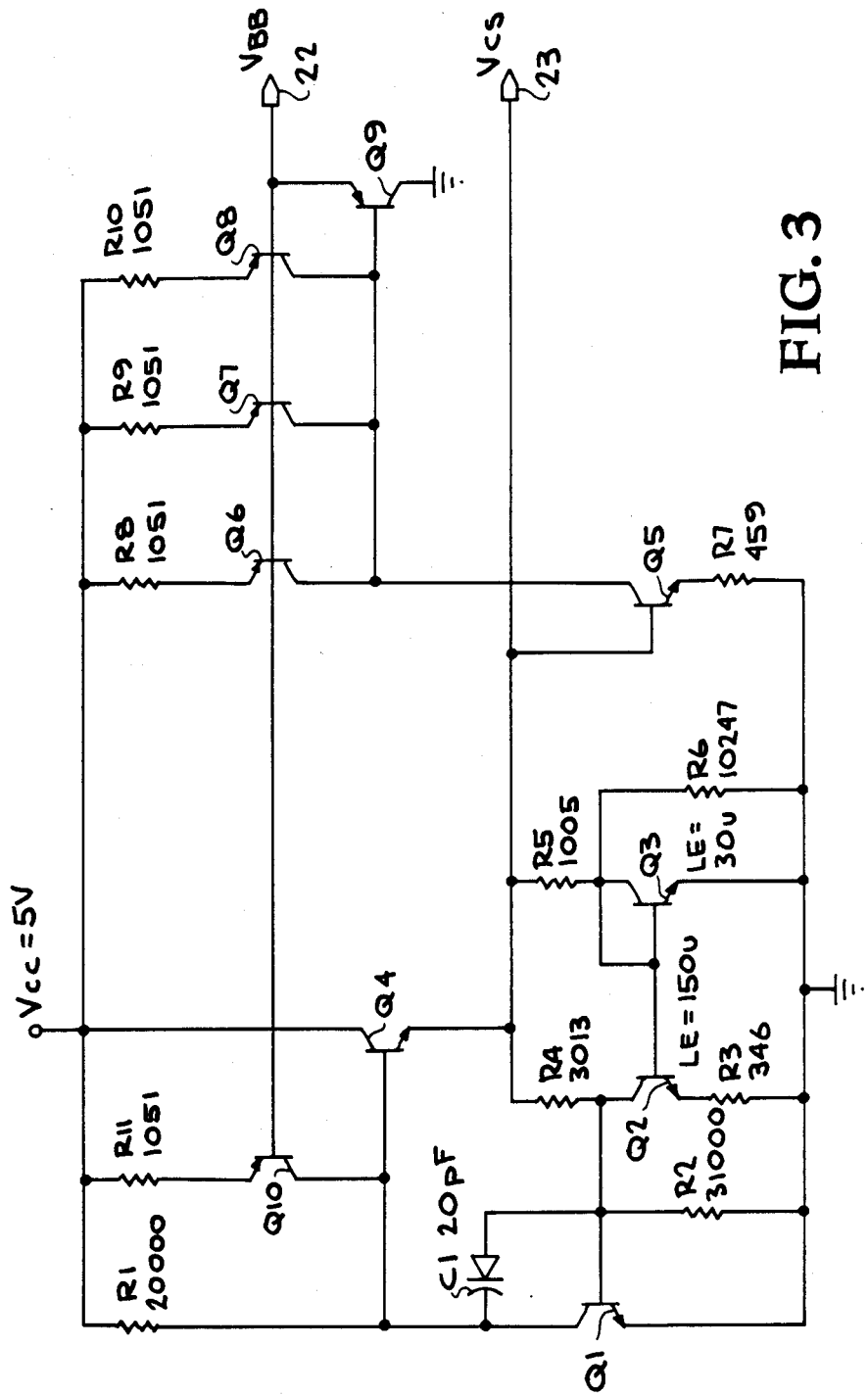
FIG. 3 is a schematic circuit diagram of a bandgap circuit for use in the block 14 of FIG. 1 or FIG. 2.

A detailed schematic circuit diagram of the bandgap circuit portion 14 is illustrated in FIG. 3 of the drawings. The bandgap circuit portion 14 generates at its output terminal 22 the first temperature-dependent reference voltage VBB which varies over the temperature range of $-55°$ C. to $+155°$ C. Typically, this reference voltage VBB on the output terminal 22 is set to be approximately 4.13 volts at room temperature and is fed to the input terminal 20 of the logic circuit portion 12.

As can be seen from FIG. 1, when one or more of the input logic signals IN1 . . . INn is at the high logic level the corresponding outputs of the input buffer/inverters INV1 . . . INVn will be at a low logic level. As a result, the input buffer/inverters will actively pull the common sense line 16 low through the corresponding diodes D1 . . . Dn and thus sink all of the current flowing from the current source IS. On the other hand, when all of the input logic signals IN1 . . . INn are at a low logic level the corresponding outputs of the input buffer/inverters will be at the high logic level. In this condition, all of the diodes D1 . . . Dn will be reverse biased, and the current source IS will cause the common sense line 16 to go to a high logic level.

In the AC performance or switching mode of operation, the amount of time required for the node A to make a high-to-low transition is referred to as a propagation delay time $t_{pd+-}$ and the amount of time to make a low-to-high transition is referred to as a propagation delay time $t_{pd-+}$. The propagation delay times are a function of the switching current and load capacitance and can be expressed mathematically as follows:

$$\Delta t = \Delta VC/I_{sc} \qquad (1)$$

where:
  $\Delta t$ is the propagation delay time
  $\Delta V$ is the voltage swing between the high and low logic levels
  C is the load capacitance
  $I_{sc}$ is the switching current In the case of a high-to-low transition, the common sense line 16 is actively pulled low by the output of one or more of the inverters INV1 . . . INVn, thereby causing sinking current to flow through the corresponding diodes D1 . . . Dn. This switching current $I_{sc+-}$ for the high-to-low transition will discharge the load capacitance and thus actively pull the common sense line 16 to a low logic level. However, in the case of a low-to-high transition the switching current $I_{sc-+}$ will be different since the output of the inverters INV1 . . . INVn cannot actively force or pull the sense line 16 to a high logic level. This is due to the fact that the corresponding diodes D1 . . . Dn will be blocking any current flow in the direction needed to charge the load capacitance C to the high logic level. Consequently, the only charging current available to charge the load capacitance C will be from the current source IS to provide the switching current $I_{sc-+}$.

Since it can be seen from the above equation (1) that the propagation delay time $\Delta t$ is inversely proportional to the switching current $I_{sc}$, any reduction in the switching current $I_{sc-+}$ for the low-to-high transition will increase the propagation delay time $t_{pd-+}$. The emitter resistor R12 in the current source IS is usually formed by some kind of doped silicon on the integrated circuit. The emitter resistor R12 will exhibit a positive temperature coefficient over the temperature range of $-55°$ C. to $+155°$ C. Consequently, the switching current tends to decrease at the higher temperatures, thereby causing increased propagation delays. Accordingly, in order to avoid degradation of the AC performance at the higher temperatures, it is necessary to increase proportionally the voltage drop Vref(R12) across the resistor R12 as the value of the resistance increases with the temperature, thereby providing a constant current flowing therethrough.

This is achieved by the provision of the first temperature-dependent reference voltage VBB (FIG. 3) from the bandgap circuit portion 14. The reference voltage VBB as a function of the temperature will be equal to the following:

$$VBB(T) = VCC - Vref(RB)(T) - V_{be(Q6)}(T) \qquad (2)$$

where:
  VCC is the supply potential
  Vref(R8) is the voltage drop across resistor R8
  $V_{be(Q6)}$ is the base-emitter voltage of transistor Q6
  the voltage Vred(R8) has a positive temperature coefficient and will increase with temperature. The base-emitter voltage of the transistor Q6 has a negative temperature coefficient and will decrease at the known rate of $-1.8$ mV/°C. Thus, the first temperature-dependent voltage VBB will be determined by the algebraic sum set forth in equation (2). A temperature-dependent voltage Vref(R12) will be generated across the resistor R12 and has the same temperature dependence as the voltage Vref(R8). Consequently, the voltage Vref(R12) will increase proportionally with temperature as the resistance value of the resistor R12 increases with temperature. As a result, the switching current $I_{sc-+}$ will be constant over temperature, thereby producing a constant propagation delay time $t_{pd-+}$.

As can be seen from FIG. 3, the bandgap circuit portion 14 includes a transistor Q1 having its collector connected via a resistor R1 to a supply potential VCC, which is the same as the one for the logic circuit portion 12, its base connected to one end of a resistor R2, and its emitter connected to a ground potential. The other end of the resistor R2 is also connected to the ground potential. A capacitor C1 is connected between the collector and base of the transistor Q1. A transistor Q2 has its collector connected to the base of the transistor Q1 and to one end of a resistor R4 and its emitter connected via a resistor R3 to the ground potential. A transistor Q3 has its base and collector connected together and to the base of the transistor Q2. The collector of the transistor Q3 is further connected to one end of resistors R5 and R6. The other end of the resistor R5 is connected to the other end of the resistor R4. The other end of the resistor R6 is connected to the ground potential. The junction of the resistors R4 and R5 is further joined to the emitter of a transistor Q4. The transistor Q4 has its base connected to the collector of the transistor Q1 and its collector connected to the supply potential VCC. A transistor Q5 has its base connected to the junction of the resistors R4 and R5 and to an output terminal 23 for providing a second temperature-dependent voltage VCS. The transistor Q5 has its emitter connected via a resistor R7 to the ground potential.

A transistor Q6 has its emitter connected to the supply potential VCC via a resistor R8. A transistor Q7 has its emitter connected to the supply potential VCC via a resistor R9. A transistor Q8 has its emitter connected to the supply potential VCC via a resistor R10. The collectors of the transistors Q6, Q7 and Q8 are connected together and to the base of a transistor Q9. The bases of the transistors Q6, Q7 and Q8 are also connected together and to the emitter of the transistor Q9, to the base of a transistor Q10, and to the output terminal 22 for providing the first temperature-dependent reference voltage VBB. The collector of the transistor Q9 is connected to the ground potential. The transistor Q10 has its emitter connected via a resistor R11 to the supply potential VCC and its collector connected to the base of the transistor Q4.

It should be understood by those skilled in the art that the logic circuit portion 12 and the bandgap circuit portion 14 may be formed as an integrated circuit on a single semiconductor chip. Further, the fuses F1 . . . Fn may, for example, be metal, silicide, or a semiconductor such as a polysilicon material which may be opened or blown by the use of a programming circuit or laser cut. Each of the fuses F1 . . . Fn is selectively blown during programming in order to provide a desired logic function.

A computer simulation of FIG. 1 resulted in the corresponding reference voltages VBB and voltage drops Vref(R12) across the emitter resistor R12 shown in Table I below for the temperatures of −55° C., +25° C. and +155° C. with the supply voltage being held at +5.5 volts.

TABLE I

|  | TEMPERATURE | | |
| --- | --- | --- | --- |
|  | −55° C. | +25° C. | +155° C. |
| VBB | +4.11 V | +4.13 V | +4.13 V |
| Vref(R12) | +0.538 V | +0.659 V | +0.887 V |

Since the voltage drop Vref(R12) is also increasing with temperature as the resistance values of the resistor R12 is increasing with temperature, this results in the current flowing through the node A remaining substantially constant with temperature variations. The values of the switching current $I_{sc-+}$ obtained from the simulation of the circuit of FIG. 1 are shown in Table II below for the temperatures of −55° C., +25° C. and +155° C. when the supply potential of +5.5 volts was used.

TABLE II

|  | TEMPERATURE | | |
| --- | --- | --- | --- |
|  | −55° C. | +25° C. | +155° C. |
| $I_{sc-+}$ | .294 mA | .324 mA | .321 mA |

As can be seen, the switching current values at the node A is changed only approximately 10 percent over the temperature ranges of −55° C. to +155° C. Thus, the propagation delay time has not been degraded at the higher temperatures.

Figure 2:
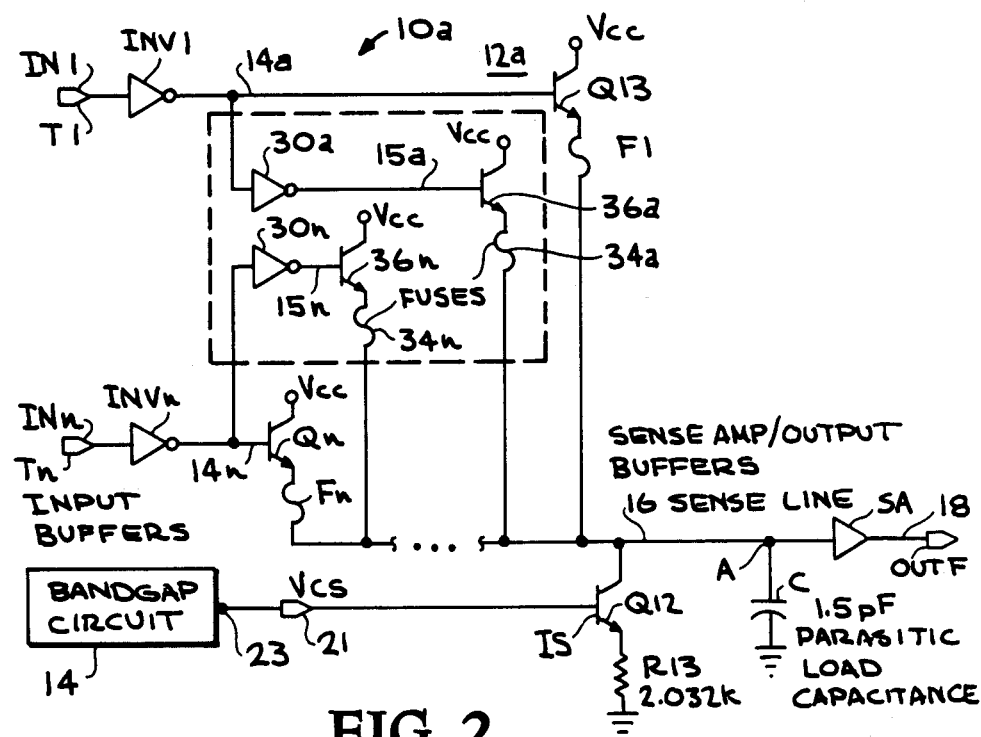
FIG. 2 is a schematic circuit diagram of a bipolar programmable logic array which is arranged in an OR array and embodies the principles of the present invention.

In FIG. 2 of the drawings, there is illustrated a second embodiment of a bipolar PLA 10a of the present invention which is arranged in what is called an OR array. The bipolar PLA 10a is comprised of a logic circuit portion 12a and the bandgap circuit portion 14.

The logic circuit portion 12a similarly includes a plurality of input buffer/inverters INV1 . . . INVn. Input logic signals IN1 . . . INn on respective input terminals T1 . . . Tn are connected to the corresponding inputs of the plurality of input buffer/inverters INV1 . . . INVn. The output of the inverter INV1 on the line 14a is connected to the base of an emitter follower transistor Q13. The transistor Q13 has its collector connected to the supply potential VCC and its emitter connected to one end of a fuse F1. The other end of the fuse F1 is connected to a common node A. Likewise, the output of the inverter INVn on the line 14n is connected to the base of an emitter follower transistor Qn. The transistor Qn has its collector connected to the supply potential VCC and its emitter connected to one end of a fuse Fn. The other end of the fuse Fn is connected to the common node A.

It should be understood that an optional inverter 30a may be included to generate a non-inverted output signal on line 15a. The inverter 30a has its input connected to the output of the inverter INV1 and its output connected to the base of an optional transistor 36a. The emitter of the transistor 36a is connected to one end of an optional blowable fuse 34a. The other end of the fuse 34a is connected to the common node A. The collector of the transistor 36a is connected to the supply potential VCC. Similarly, an optional inverter 30n may be included to generate a non-inverted output signal on line 15n. The inverter 30n has its input connected to the output of the inverter INVn and its output connected to the base of an optional transistor 36n. The emitter of the transistor 36n is connected to one end of an optional blowable fuse 34a. The other end of the fuse 34n is connected to the common node A. The collector of the transistor 36n is connected to the supply potential VCC.

The logic circuit portion 12a also includes a sense amp/output buffer SA and a parasitic load capacitance C. The input of the sense amp/output buffer SA is connected to one end of the load capacitance C and to the common node A via a common sense line 16. The output of the sense amp/output buffer SA is connected to an output terminal F via line 18. The output terminal F defines the output of the bipolar PLA 10a. The logic circuit portion 12a further includes a current source IS formed of a bipolar NPN-type transistor Q12 and an emitter resistor R13. The transistor Q12 has its emitter connected to one end of the resistor R13 and its collector connected to the common node A. The other end of the resistor R13 is connected to a ground potential. The base of the transistor Q12 is connected to an input terminal 21 for receiving temperature-dependent reference voltage VCS from the bandgap circuit portion 14. As can be seen from FIG. 3, the bandgap circuit portion generates at its output terminal 23 the second temperature-dependent reference voltage VCS which varies over the temperature range of $-55°$ C. to $+155°$ C. Typically, this reference voltage VCS on the output terminal 23 is set to be approximately 1.53 volts at room temperature and is fed to the input terminal 21 of the logic circuit portion 12a.

As can be seen from FIG. 2, the bipolar PLA 10a operates in a manner similar to the bipolar PLA 10 shown in FIG. 1, except that the sense line 16 is actively pulled high by one or more of the emitter follower transistors Q13 . . . Qn and is passively pulled low by the current source IS formed of the transistor Q12 and the emitter resistor R13. Again, in order to avoid degradation of the AC performance at the higher temperatures, it is necessary to increase proportionally the voltage drop Vref(R13) across the resistor R13 as the value of the resistance increases with temperature, thus providing a constant current flowing therethrough. This is achieved by the provision of the second temperature-dependent reference voltage VSC (FIG. 3) from the bandgap circuit portion 14. This reference voltage VCS as a function of temperature will be equal to the following:

$$VCS(T) = V_{be(Q5)}(T) + Vref(R7)(T) \quad (3)$$

where:
$V_{be(Q5)}$ is the base-emitter voltage of transistor Q5
Vref(R7) is the voltage drop across transistor R7

The voltage Vref(R7) has a positive temperature coefficient and will increase with temperature. The base-emitter voltage of the transistor Q5 has a negative temperature coefficient and will decrease at the known rate of $-1.8$ mV/°C. Thus, the second temperature-dependent voltage VCS will be determined by the algebraic sum set forth in equation (3). A temperature-dependent voltage Vref(R13) will be generated across the resistor R13 and has the same temperature dependence as the voltage Vref(R7). Consequently, the voltage Vref(R13) will increase proportionally with temperature as the resistance value of the resistor R13 increases with temperature. As a result, the switching current $I_{sc+-}$ will be constant over temperature, thereby producing a constant propagation delay time $t_{pd+-}$.

From the foregoing detailed description, it can thus be seen that the present invention provides a bipolar programmable logic array which has a high speed of operation and maintains constant power dissipation over a wide range of temperature variations. The bipolar programmable logic array is formed of a bandgap circuit for generating a temperature-dependent reference voltage and a current source responsive to the reference voltage for producing a switching current to a common sense line which is substantially constant over a wide range of temperature variations.

While there has been illustrated and described what are at present considered to be a preferred embodiments of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiments disclosed as the best modes contemplated for carrying out the invention, but that the invention will include all embodiments falling within the scope of the appended claims.

What is claimed is:

1. A bipolar programmable logic array having a current source which is compensated for temperature variations comprising:
   a plurality of input buffer/inverters (INV1 . . . INVn), each of said plurality of input buffer/inverts having an input, for receiving an input logic signal, and an output;
   a plurality of diodes (D1 . . . Dn), each of said plurality of diodes having its cathode connected to a respective output of a corresponding input buffer-/inverter and its anode coupled to a common sense line (16);
   a sense amplifier/output buffer (SA) having its input connected to the common sense line (16) and its output connected to an output terminal;
   a current source (IS) being formed of a PNP-type transistor (Q11) and a resistor (R12), said transistor having its emitter coupled to a supply potential via said resistor (R12) and its collector connected to the common sense line (16);
   said current source transistor (Q11) charging said common senses line to a high logic level when all of the input logic signals are in a low logic level;
   bandgap circuit means (14) for generating a first temperature-dependent reference voltage (VBB), said transistor having its base connected to receive said first temperature-dependent reference voltage; and wherein
   a second temperature-dependent reference voltage (Vref(R12)) proportional to said first temperature-dependent reference voltage is generated across said resistor (R12) which increases proportional to the increasing values of said resistor (R12) over temperature so that the current flowing through said current source transistor (Q11) remains substantially constant.

2. A logic array as claimed in claim 1, wherein said plurality of diodes comprise Schottky didoes (D1 . . . Dn).

3. A logic array as claimed in claim 1, wherein the temperature variations are between $-55°$ C. and $+155°$ C.

4. A logic array as claimed in claim 1, wherein said logic array is formed as an integrated circuit on a single semiconductor chip.

5. A logic array as claimed in claim 1, further comprising a plurality of blowable fuses (F1 . . . Fn), each fuse being interconnected between a respective anode of a corresponding diode (D1 . . . Dn) and the common sense line 16, each of said fuses being selectively blown during programming to provide a desired logic function.

6. A logic array as claimed in claim 5, wherein said fuses (F1 . . . Fn) are formed of one of a polysilicon material, silicide, and metal.

7. A logic array as claimed in claim 6, wherein said fuses (F1 . . . Fn) are blown by one of a programming current and laser cut.

8. A bipolar programmable logic array having a current source which is compensated for temperature variations comprising:
 a plurality of input buffer/inverters (INV1 . . . INVn), each of said plurality of input buffer/inverters having an input, for receiving an input logic signal, and an output;
 a plurality of transistors (Q13 . . . Qn), each of said plurality of transistors having its base connected to the respective outputs of said input buffer/inverters, its collector connected to a supply potential and its emitter coupled to a common sense line (16);
 a sense amplifier/output buffer (SA) having its input connected to the common sense line (16) and its output connected to an output terminal;
 a current source (IS) being formed of an NPN-type transistor (Q12) and a resistor (R13), said current source transistor having its emitter coupled to the ground potential via said resistor (R13) and its collector connected to the common sense line (16); said current source transistor (Q12) discharging said common sense line to a low logic level when all of the input logic signals are in a high logic level;
 bandgap circuit means (14) for generating a first temperature-dependent reference voltage (VCS), said current source transistor (Q12) having its base connected to receive said first temperature-dependent reference voltage; and wherein
 a second temperature-dependent reference voltage (Vref(R13)) proportional to said first temperature-dependent reference voltage is generated across said resistor (R13) which increases proportional to the increasing values of said resistor (R13) over temperature so that the current flowing through said current source transistor remains substantially constant.

9. A logic array as claimed in claim 8, wherein said plurality of transistors (Q13 . . . Qn) are of the NPN-type conductivity.

10. A logic array as claimed in claim 8, wherein the temperature variations are between −55° C. and +155° C.

11. A logic array as claimed in claim 8, wherein said logic array is formed as an integrated circuit on a single semiconductor chip.

12. A logic array as claimed in claim 8, further comprising a plurality of blowable fuses (F1 . . . Fn), each fuse being interconnected between a respective emitter of a corresponding one of said plurality of transistors and the common sense line (16), each of said fuses being selectively blown during programming to provide a desired logic function.

13. A logic array as claimed in claim 12, wherein said fuses (F1 . . . Fn) are formed of one of a polysilicon material, silicide, and metal.

14. A logic array as claimed in claim 13, wherein said fuses (F1 . . . Fn) are blown by one of a programming current and laser cut.

* * * * *